(12) United States Patent
Han

(10) Patent No.: US 7,652,933 B2
(45) Date of Patent: Jan. 26, 2010

(54) VOLTAGE GENERATING CIRCUIT OF SEMICONDUCTOR MEMORY APPARATUS CAPABLE OF REDUCING POWER CONSUMPTION

(76) Inventor: Hi Hyun Han, San 136-1, Ami-ri, Bubaleub, Ichon-shi, Gyeonggi-do (KR) 467-860

( * ) Notice: Subject to any disclaimer, the term of this patent is extended or adjusted under 35 U.S.C. 154(b) by 67 days.

(21) Appl. No.: 11/826,328

(22) Filed: Jul. 13, 2007

(65) Prior Publication Data

US 2008/0159016 A1 Jul. 3, 2008

(30) Foreign Application Priority Data

Dec. 28, 2006 (KR) ............... 10-2006-0136785

(51) Int. Cl.
*G11C 11/00* (2006.01)
(52) U.S. Cl. .................... 365/189.09; 365/226
(58) Field of Classification Search ........... 365/189.09, 365/226
See application file for complete search history.

(56) References Cited

U.S. PATENT DOCUMENTS

| | | | |
|---|---|---|---|
| 6,347,058 B1 | 2/2002 | Houghton et al. | |
| 6,996,023 B2 * | 2/2006 | Kim | 365/226 |
| 7,020,043 B1 | 3/2006 | Lee | |
| 7,038,957 B2 | 5/2006 | Kwack et al. | |
| 7,158,430 B2 | 1/2007 | Byun | |
| 2006/0267630 A1 | 11/2006 | Matsui | |
| 2006/0268630 A1 | 11/2006 | Park et al. | |
| 2007/0070674 A1* | 3/2007 | Im et al. | 365/63 |
| 2007/0070711 A1* | 3/2007 | Kim | 365/189.01 |
| 2007/0070784 A1* | 3/2007 | Kang | 365/230.06 |

FOREIGN PATENT DOCUMENTS

| | | |
|---|---|---|
| JP | 11-273346 | 10/1999 |
| JP | 2006-286163 | 10/2006 |
| JP | 2006-309916 | 11/2006 |
| KR | 1020010011521 A | 2/2001 |
| KR | 1020040100714 A | 12/2004 |

* cited by examiner

*Primary Examiner*—Michael T Tran
(74) *Attorney, Agent, or Firm*—Venable LLP; Jeffri A. Kaminski

(57) ABSTRACT

A voltage generating circuit of a semiconductor memory apparatus is provided including a voltage generator that generates a core voltage in response to a voltage generating signal, a voltage drop part that drops a level of the core voltage to a predetermined target level when the level of the core voltage is increased by an overdrive operation, and a voltage generation controller that disables the voltage generating signal when the overdrive operation is performed so as to stop the driving of the voltage generator.

12 Claims, 3 Drawing Sheets

US 7,652,933 B2

VOLTAGE GENERATING CIRCUIT OF SEMICONDUCTOR MEMORY APPARATUS CAPABLE OF REDUCING POWER CONSUMPTION

CROSS-REFERENCE TO RELATED PATENT APPLICATION

This application claims the benefit of Korean Patent Application No. 10-2006-0136785, filed on Dec. 28, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a voltage generating circuit of a semiconductor memory apparatus.

2. Related Art

In general semiconductor memory apparatuses, when an active command is input, a bank is activated and the data in the memory cells are transmitted to a sense amplifier through the bit lines. The sense amplifier performs a sensing operation on the transmitted data. In order to accurately and quickly perform the sensing operation, the sense amplifier performs an overdrive operation.

During the sensing operation of the sense amplifier, a voltage stored in the memory cells, i.e., a core voltage, is applied to the bit lines precharged with a bit line precharge voltage and to the bit line bars, and a voltage difference between the bit line and the bit line bar is amplified. When the sensing operation begins, an external voltage is applied to the bit lines for a predetermined amount of time, which is the overdrive operation.

The core voltage is applied to the memory cells. When the core voltage level is higher than a target level, memory cells may become defective. When the core voltage level is lower than the target level, the data may not be appropriately preserved. Therefore, the core voltage needs to maintain a constant level.

The core voltage is generated by a voltage generating circuit provided in the semiconductor memory apparatus. When the core voltage level is increased by the overdrive operation, the voltage generating circuit reduces the core voltage level to the target level by comparing the level of the core voltage with a level of a reference voltage.

The problem with the conventional voltage generating circuits is that when an overdrive operation that is not associated with the generation and adjustment of the core voltage and any other operations are being performed, the voltage generating circuit continues its operation to generate and/or adjust the core voltage. However, his conventional approach increases the power consumption of the semiconductor memory apparatus.

SUMMARY OF THE INVENTION

Embodiments of the present invention provide a voltage generating circuit of a semiconductor memory apparatus that is capable of reducing power consumption through a selective operation.

The voltage generating circuit of the present invention performing an overdrive operation, according to a first embodiment, includes a voltage generation controller that disables a voltage generating signal when the semiconductor memory apparatus receives an external clock and read and write operations are not performed, and a voltage generator that generates a core voltage in response to the voltage generating signal.

According to an alternative embodiment of the present invention, the voltage generating circuit includes a voltage drop controller that generates a voltage drop signal that is enabled for a predetermined amount of time when an overdrive operation ends, a voltage generation controller that receives the voltage drop signal and outputs a voltage generating signal that is enabled for a predetermined amount of time, and a voltage generator that generates a core voltage in response to the voltage drop signal.

According to yet another embodiment of the present invention, the voltage generating circuit includes a voltage generator that generates a core voltage in response to a voltage generating signal, a voltage drop part that drops a level of the core voltage to a target level when the level of the core voltage is increased by an overdrive operation, and a voltage generation controller that disables the voltage generating signal when the overdrive operation is performed, such that the driving of the voltage generator is stopped.

DESCRIPTION OF EXEMPLARY EMBODIMENT

Embodiments of the present invention will now be described in detail with reference to the accompanying drawings.

Figure 1:
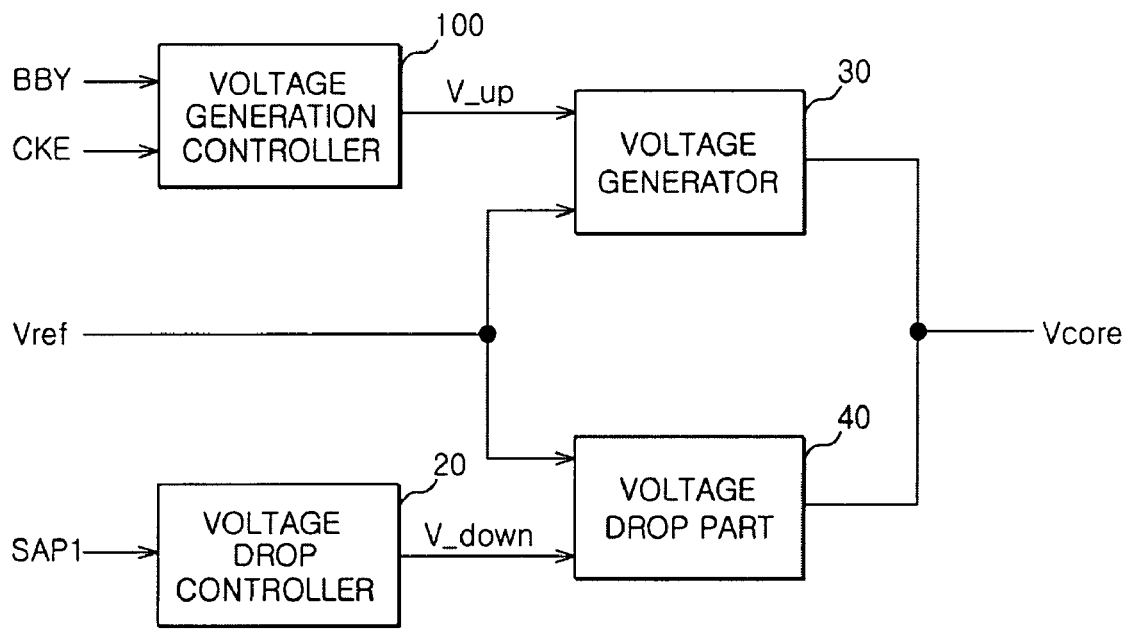
FIG. 1 depicts an exemplary block diagram illustrating a voltage generating circuit according to a first embodiment of the present invention.

Referring to FIG. 1, a voltage generating circuit according to an embodiment of the present invention may include a voltage generation controller 100, a voltage drop controller 20, a voltage generator 30, and a voltage drop part 40.

The voltage generation controller 100 enables a voltage generating signal V_up when a read or write command is input or a semiconductor memory apparatus does not use an external clock, and disables the voltage generating signal V_up in the other cases. The voltage generation controller 100 takes an operation state signal BBY and a clock enable signal CKE as inputs. The operation state signal BBY is at a logic high when a bank performs a read or write operation and at a logic low when the read or write operation is completed. The clock enable signal CKE is used to select whether the semiconductor memory apparatus receives the external clock or not.

The voltage drop controller 20 generates a voltage drop signal V_down, which indicates that the core voltage Vcore level, increased by an overdrive operation, is to be reduced.

The voltage generator 30 compares the reference voltage level Vref with the core voltage level Vcore in response to the voltage generating signal V_up and generates the core voltage Vcore. The core voltage Vcore is applied to memory cells.

The voltage drop part 40 compares the reference voltage level Vref with the core voltage level Vcore in response to the voltage drop signal V_down. When the core voltage level Vcore is higher than the reference voltage level Vref, the voltage drop part 40 reduces the level of the core voltage Vcore by connecting a terminal of the core voltage Vcore to a ground terminal.

Figure 3:
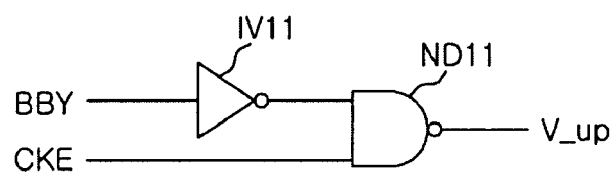
FIG. 3 depicts an exemplary circuit diagram illustrating the voltage generation controller of FIG. 1.

As shown in FIG. 3, the voltage generation controller 100 enables the voltage generating signal V_up when the bank executes a read or write command or the semiconductor memory apparatus does not receive the external clock (for example, a power down mode or a self refresh mode). According to an embodiment of the invention depicted in FIG. 3, the voltage generation controller 100 may include an inverter IV11 that inverts the operation state signal BBY, and a NAND gate ND11 that receives the clock enable signal CKE and an output signal of the inverter IV11 and outputs the voltage generating signal V_up.

Figure 2:
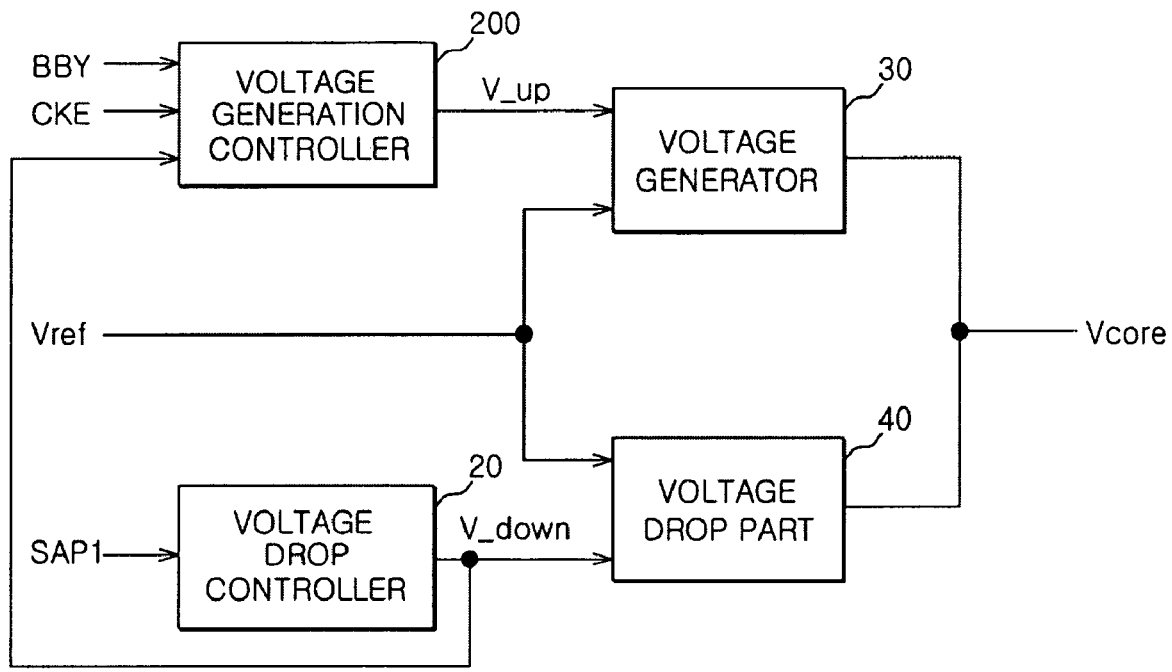
FIG. 2 depicts an exemplary block diagram illustrating a voltage generating circuit according to a second embodiment of the present invention.

Referring now to FIG. 2, there is depicted a block diagram illustrating a voltage generating circuit according to a second embodiment of the present invention. In this embodiment, a voltage generation controller 200 receives the voltage drop signal V_down outputted from the voltage drop controller 20. The voltage generation controller 200 is configured such that, when the voltage drop signal V_down is disabled, the generation controller 200 outputs a voltage generating signal V_up that is enabled for a predetermined amount of time. When the bank performs the read or write operation or the semiconductor memory apparatus does not use the external clock, the voltage generation controller 200 enables the voltage generating signal V_up. At this time, the voltage drop signal V_down is an output signal of the voltage drop controller 20. When the overdrive operation ends, the voltage drop signal V_down is enabled for a predetermined amount of time.

Figure 4:
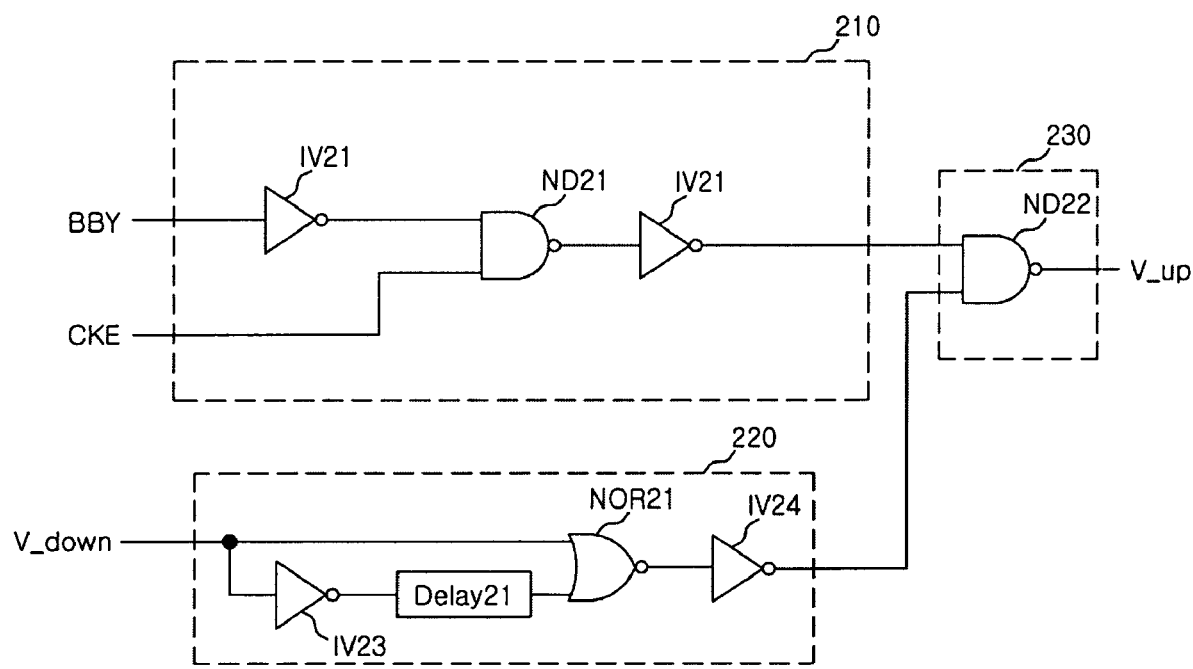
FIG. 4 depicts an exemplary circuit diagram illustrating the voltage generation controller of FIG. 2.

As shown in FIG. 4, according to an embodiment of the invention, the voltage generation controller 200 may include a first control unit 210, a second control unit 220, and a signal combining unit 230. The first control unit 210 disables the voltage generating signal V_up when the semiconductor memory apparatus receives the external clock and the bank does not perform the read and write operations. When the overdrive operation ends and the voltage drop operation is completed, i.e., the voltage drop signal V_down is disabled, the second control unit 220 enables the voltage generating signal V_up for a predetermined amount of time. The signal combining unit 230 combines the output signals of the first control unit 210 and the second control unit 220 to generate the voltage generating signal V_up.

According to an embodiment of the invention, the first control unit 210 receives the operation state signal BBY and the clock enable signal CKE and disables the voltage generating signal V_up. The operation state signal BBY may be, for example, a signal that has a high value when the bank performs the read or write operation and a low value when the read or write operation ends. Further, the clock enable signal CKE may be, for example, a signal that has a high value when the semiconductor memory apparatus receives the external clock and a low value when the semiconductor memory apparatus does not receive the external clock.

The first control unit 210 may include a first inverter IV21 that inverts the operation state signal BBY, a first NAND gate ND21 that receives an output signal of the first inverter IV21 and the clock enable signal CKE, and a second inverter IV22 that inverts an output signal of the first NAND gate ND21 and outputs an output signal of the first control unit 210.

According to an embodiment of the invention, the second control unit 220 receives the voltage drop signal V_down and enables the voltage generating signal V_up for a predetermined amount of time when the voltage drop signal V_down is disabled. The second control unit 220 may includes a third inverter IV23 that inverts the voltage drop signal V_down, a delayer Delay21 that delays an output signal of the third inverter IV23, a NOR gate NOR21 that receives the voltage drop signal V_down and an output signal of the delayer Delay21, and a fourth inverter IV24 that inverts an output signal of the NOR gate NOR21 and outputs the inverted signal as an output signal of the second control unit 220.

The signal combining unit 230 may include a third NAND gate ND22 that receives the output signals of the first control unit 210 and the second control unit 220 to generate the voltage generating signal V_up.

The operation of the voltage generating circuit of the semiconductor memory apparatus according to the embodiment of the present invention that has the above-described structure will now be described.

Figure 5:
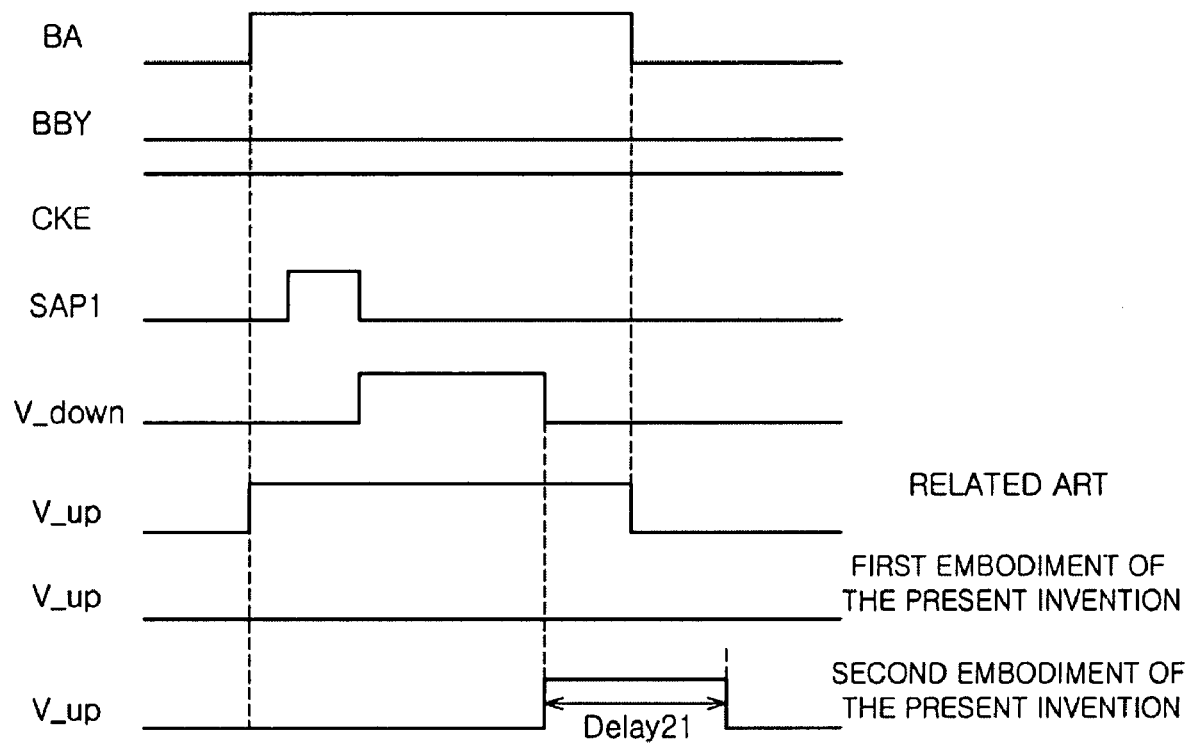
FIG. 5 is a timing diagram illustrating the operation of a voltage generating circuit according to an embodiment of the present invention.

Referring to FIG. 5, when the semiconductor memory apparatus receives the external clock and the bank does not perform the read and write operations, the semiconductor memory apparatus operating an overdrive operation does not need to enable the voltage generating signal V_up to operate the voltage generator 30 in order to generate the core voltage Vcore. That is, since the overdrive operation temporarily increases the core voltage level Vcore to the level of an external voltage, there is no need to separately generate the core voltage Vcore.

Therefore, the voltage generation controller 100 may disable the voltage generating signal V_up by a combination of the operation state signal BBY and the clock enable signal CKE such that the core voltage Vcore will not be generated. Specifically, according to the first embodiment of the present invention, the voltage generation controller 100 of the voltage generating circuit disables the voltage generating signal V_up at a logic low level when the bank does not perform the read and write operations (i.e., when the operation state signal BBY is at a logic low), and when the semiconductor memory apparatus receives and uses the external clock (i.e., when the clock enable signal CKE is at a logic high), such as when the apparatus is not in power down mode or self refresh mode.

Further, according to the second embodiment of the invention as shown in FIG. 2, when the voltage drop signal V_down is input to the voltage generation controller 200, if the overdrive operation ends and the voltage drop operation is completed, the voltage generation controller 200 allows the voltage generating circuit to generate the core voltage Vcore for a predetermined amount of time. The voltage drop operation is performed to reduce the level of the core voltage Vcore that is increased when the overdrive operation ends. Therefore, after the voltage drop operation is completed, when the level of the core voltage Vcore is lower than the level of the reference voltage Vref, the voltage generation controller 200 outputs the voltage generating signal V_up such that the voltage generating circuit can generate the core voltage Vcore.

Accordingly, the voltage generation controller 200 shown in FIG. 2 outputs the voltage generation control signal V_up at a logic low when the operation state signal BBY is at a logic low level and the clock enable signal CKE is at a logic high level. When the voltage drop signal V_down is disabled at a logic low level, the voltage generation controller 200 outputs the voltage generating signal V_up that is enabled at a high level for a predetermined amount of time.

The voltage generating circuit shown in FIG. 2 outputs the voltage generating signal V_up at a logic low when the semiconductor memory apparatus receives the external clock and the bank does not perform the read and write operations, and generates the core voltage Vcore for a predetermined amount of time when the overdrive operation ends and the voltage drop operation is completed.

As described above, according to the embodiments of the present invention, the voltage generation controller is provided in the voltage generating circuit of the semiconductor memory apparatus, such that the voltage generating circuit is turned off when the level of the core voltage is increased by the overdrive operation. The selective operation of the voltage generating circuit leads to a significant reduction in power consumption of the semiconductor memory apparatus.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A voltage generating circuit for a semiconductor memory apparatus that performs an overdrive operation, the voltage generating circuit comprising:
    a voltage generation controller configured to receive an operation state signal and a clock enable signal and to generate a voltage generating signal for generating a core voltage; and
    a voltage generator configured to generate the core voltage in response to the voltage generating signal,
    wherein the voltage generating signal is disabled when the operation state of the semiconductor memory apparatus is the overdriving mode corresponding to a beginning portion of a sensing operation, so as to stop generating of the core voltage.

2. The voltage generating circuit of claim 1,
    wherein the voltage generation controller includes:
    an inverter that inverts the operation state signal to provide an output signal; and
    a NAND gate that receives the output signal of the inverter and the clock enable signal and outputs the voltage generating signal.

3. A voltage generating circuit for a semiconductor memory apparatus comprising:
    a voltage drop controller configured to generate a voltage drop signal that is enabled for a predetermined amount of time when an overdrive operation ends;
    a voltage generation controller configured to receive the voltage drop signal to output a voltage generating signal for generating a core voltage that is enabled for a predetermined amount of time; and
    a voltage generator configured to generate the core voltage in response to the voltage drop signal and the voltage generating signal,
    wherein the voltage generating signal is disabled when an operation mode of the semiconductor memory apparatus is the overdrive operation, to stop a generation of the core voltage.

4. The voltage generating circuit of claim 3,
    wherein the voltage generating signal is enabled for the predetermined amount of time when the voltage drop signal is disabled, and
    the voltage generator is configured to generate the core voltage when the voltage generating signal is enabled.

5. The voltage generating circuit of claim 3,
    wherein the voltage generation controller includes:
    a first control unit that outputs a disabled voltage generating signal when the semiconductor memory apparatus receives the external clock and the read and write operations are not performed;
    a second control unit that receives the voltage drop signal to output an enabled voltage generating signal for a predetermined amount of time; and
    a signal combining unit that combines output signals of the first control unit and the second control unit and generates the voltage generating signal.

6. The voltage generating circuit of claim 5,
    wherein the first control unit receives an operation state signal and a clock enable signal to enable the voltage generating signal.

7. The voltage generating circuit of claim 6,
    wherein the first control unit includes:
    a first inverter that inverts the operation state signal to provide an output signal;
    a NAND gate that receives the output signal of the first inverter and the clock enable signal as input and provides an output based thereon; and
    a second inverter that inverts and outputs then output signal of the NAND gate.

8. The voltage generating circuit of claim 5,
    wherein the second control unit enables the voltage generating signal for a predetermined amount of time when the voltage drop signal is disabled.

9. The voltage generating circuit of claim 8,
    wherein the second control unit includes:
    a first inverter that inverts the voltage drop signal to provide an output signal;
    a delayer that delays the output signal of the first inverter to provide an output signal;
    a NOR gate that receives the voltage drop signal and the output signal of the delayer; and
    a second inverter that inverts and outputs the output signal of the NOR gate.

10. The voltage generating circuit of claim 5,
    wherein the signal combining unit includes a NAND gate that receives the output signals of the first control unit and the second control unit and outputs the voltage generating signal.

11. A voltage generating circuit for a semiconductor memory apparatus comprising:
    a voltage generator configured to generate a core voltage in response to a voltage generating signal;
    a voltage drop part configured to drop a level of the core voltage to a target level when the level of the core voltage is increased by an overdrive operation to provide an output signal; and
    a voltage generation controller configured to disable the voltage generating signal when the overdrive operation is performed, such that a generation of the core voltage is stopped, wherein the voltage generation controller includes:
    a first control unit that disables the voltage generating signal when the semiconductor memory apparatus receives an external clock and read and write operations are not performed;
    a second control unit that receives the voltage drop signal and enables the voltage generating signal for a predetermined amount of time; and
    a signal combining unit that combines output signals of the first control unit and the second control unit and generates the voltage generating signal.

12. The voltage generating circuit of claim 11,
    wherein the voltage generation controller receives the output signal of the voltage drop part and outputs a signal for driving the voltage generator when the output signal of the voltage drop part is disabled at a low level.

* * * * *